Aug. 25, 1959 H. J. WOLL 2,901,639

SEMI-CONDUCTOR MULTIVIBRATOR CIRCUIT

Filed Dec. 31, 1954

INVENTOR.
Harry J. Woll
BY H. L. Newton
ATTORNEY.

United States Patent Office 2,901,639

Patented Aug. 25, 1959

2,901,639

SEMI-CONDUCTOR MULTIVIBRATOR CIRCUIT

Harry J. Woll, Haddon Heights, N.J., assignor to Radio Corporation of America, a corporation of Delaware Application December 31, 1954, Serial No. 479,048

3 Claims. (Cl. 307—88.5)

Figure 1:
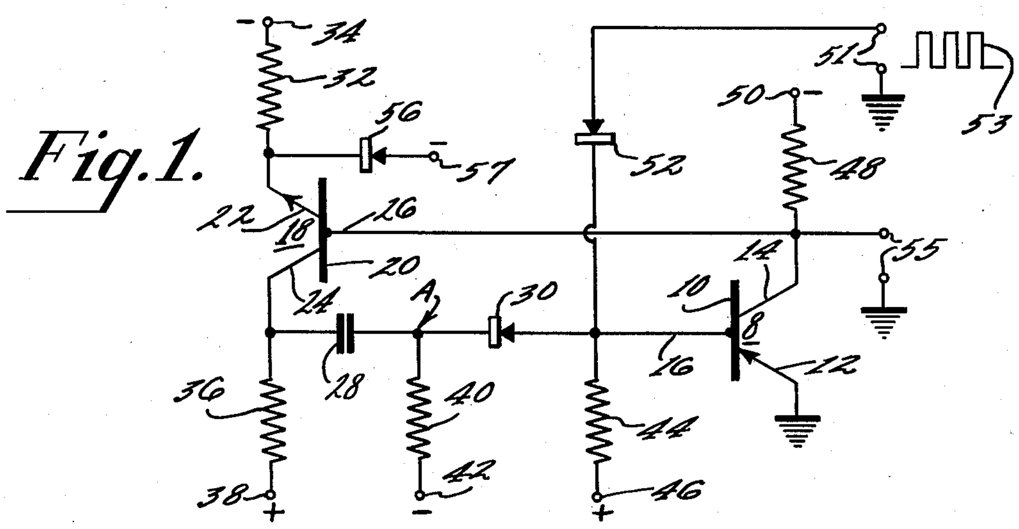

This invention relates, in general, to semi-conductor multivibrator circuits, and in particular to monostable multivibrator circuits utilizing transistors.

A multivibrator circuit is a relaxation oscillator and may be classified according to its operation into three different types. One type of multivibrator may be arranged to be free-running or self-oscillating at a predetermined frequency. The other two types of multivibrators have to be triggered by the application of electrical pulses. Thus, the multivibrator may be monostable or of the one-cycle type. In other words, when the multivibrator is triggered it will go through one cycle of oscillation and thereafter returns to the original stable state of oscillation. The multivibrator remains in the stable state until it is triggered again by the next pulse.

Monostable multivibrator circuits employing electron discharge devices or tubes are well known. In one type, the grid and anodes of a pair of tubes are intercoupled and the circuit arrangement is such that an output pulse is generated following the application of a trigger pulse to the circuit. The duration of the output pulses is determined by a timing circuit which usually consists of a timing capacitor and a timing resistor in the circuit coupling the anode of the first multivibrator tube to the grid of the second multivibrator tube. The first tube is normally cut-off and the second tube is normally conducting. The trigger pulses reverse the conductivity, as a result of which the second tube conducts for a period of time determined by the time constant of the timing circuit.

Multivibrator circuits which employ semi-conductor devices such as transistors are also well known. In one type, which is the analog of the tube circuit described above, a pair of transistors of the same conductivity type may have their collector and base electrodes intercoupled. In a manner similar to the tube circuit, the circuit arrangement is such that an output pulse is generated following the application of a trigger pulse to the circuit. The duration of the output pulse is determined by a timing circuit which is in the circuit coupling the collector electrode of the first transistor with the base of the second transistor.

For such applications, the discharge time of the timing circuit should be relatively fast. In addition, the charge time should be substantially constant. For the tube multivibrator circuits, these requirements are generally readily obtainable because tubes have a high input impedance. The input impedance of a transistor, however, is generally relatively low and these requirements are not easily obtainable.

Transistors, however, in contradistinction to tubes, may be of opposite conductivity or complementary symmetry types. It is an object of this invention, therefore, to utilize the opposite conductivity charactertistics of transistors to provide improved multivibrator circuits which are relatively stable and efficient in operation.

It is another object of this invention to provide improved and efficient monostable multivibrator circuits which utilize a pair of intercoupled transistors of opposite conductivity types for obtaining reliable circuit operation.

It is a still further object of the present invention to provide a monostable multivibrator circuit utilizing opposite conductivity type transistors wherein the circuit timing capacitor is rapidly discharged through one of the transistors and the charge time of the capacitor is substantially constant.

These and further objects and advantages of the present invention are achieved, in general, by a circuit arrangement employing a pair of transistors which are of opposite conductivity or complementary symmetry types. The base of the first transistor is coupled through a timing circuit including a capacitor to the collector of the second transistor. The base of the second transistor is directly coupled to the collector of the first transistor. Upon the application of a trigger pulse to the circuit, the circuit operation is such that the timing circuit capacitor is discharged through the collector and emitter circuit of the second transistor. This type of circuit arrangement provides circuit operation which is both reliable and efficient.

Figure 2:
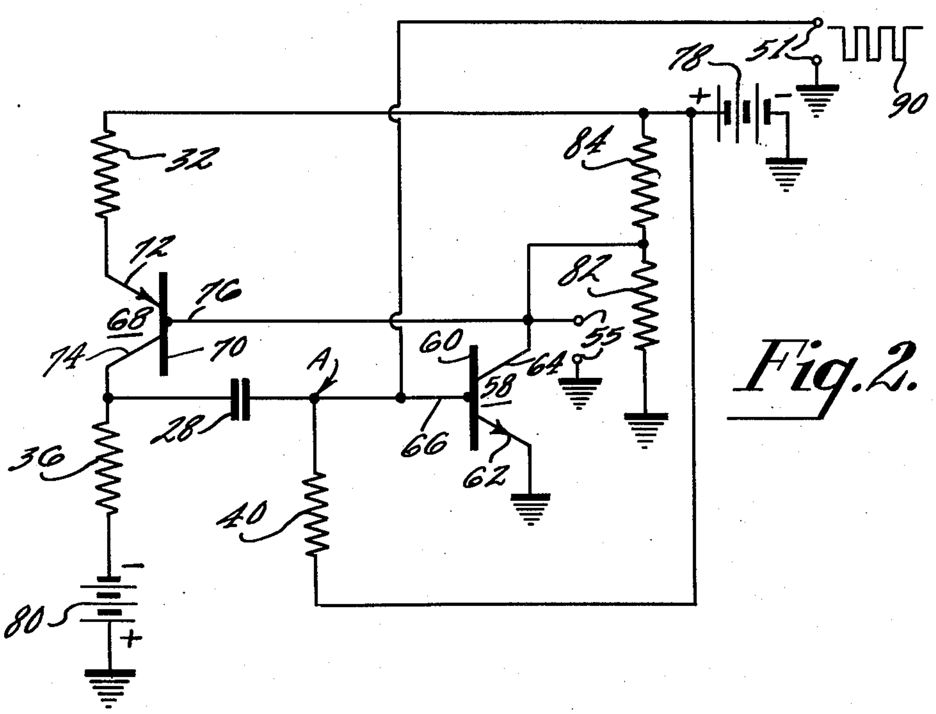

The novel features that are considered characteristic of this invention are set forth with particularity in the appended claims. The invention itself, however, both as to its organization and method of operation, as well as additional objects and advantages thereof, will best be understood from the following description when considered in connection with the accompanying drawings, in which:

Figures 1 and 2 are schematic circuit diagrams of monostable multivibrator circuits, each of which utilizes a pair of opposite conductivity type transistors in accordance with the invention.

Referring now to the drawing, wherein like parts are indicated by like reference numerals in both figures, and referring particularly to Figure 1, a monostable multivibrator circuit includes, in accordance with the invention, a pair of transistors 8 and 18 of opposite conductivity types and which may be considered to be, by way of example, a P–N–P junction transistor and an N–P–N junction transistor respectively. Each of the transistors 8 and 18 comprise a semi-conductive body with which three electrodes are cooperatively associated in a well known manner. Thus, the P–N–P transistor 8 includes a semi-conductive body 10 and an emitter 12, a collector 14 and a base 16. In the same manner the N–P–N transistor 18 includes a semi-conductive body 20 and an emitter 22, a collector 24 and a base 26.

Intercoupling of the electrodes of the two transistors is provided by connecting the collector 14 of the P–N–P transistor 8 directly with the base 26 of the N–P–N transistor 18. In addition, the collector 24 of the N–P–N transistor 28 is returned through a storage capacitor 28 and a diode 30 to the base 16 of the P–N–P transistor 8.

For normal amplifying action of a transistor, it is generally required that the bias voltage which is supplied between the emitter and base electrodes be in the forward or relatively conducting direction and that the biasing voltage which is applied between the collector and base be in the reverse or non-conducting direction. Thus, for a transistor of N type conductivity this means that the collector will be negative with respect to the base, while the emitter will be positive, also with respect to the base. For a transistor of P type conductivity on the other hand, the collector will be positive with respect to the base, while the emitter will be negative with respect to the base. The biasing voltages for the transistors in the circuits embodying the invention are of these polarities. Thus, the emitter 22 of the N–P–N transistor 18 is connected through a stabilizing resistor 32 to a terminal 34, which will normally be connected to the negative terminal of a source of direct current potential, such as a battery.

The collector 24 of the N–P–N transistor is, on the other hand, connected through a resistor 36 to a terminal 38, which will normally be connected to the positive terminal of a source of direct current potential. When the transistors are conductive, base bias for the P–N–P transistor 8 and a forward bias for the diode 30 is obtained by the connection from the junction of the diode 30 and the capacitor 28, including the resistor 40, to a terminal 42 which will normally be connected to the negative terminal of the supply voltage.

When the transistor 8 is non-conductive, the bias between its emitter and base is slightly in the reverse direction, since it is obtained by the connection from the base 16, including a resistor 44, to the terminal 46, which is connected to the positive terminal of a relatively small source of direct current voltage. The emitter 12 of the transistor 8 is connected to a point of fixed reference potential or ground for the system, while the collector 14 of this transistor is connected through a resistor 48 to a terminal 50, which may be connected to the negative terminal of the supply voltage.

Input trigger pulses may be applied to the circuit through a pair of terminals 51, one of which is grounded as shown and the other of which is connected through a pulse steering diode 52 to the base 16 of the P–N–P transistor 8. The trigger pulses 53 may be of a positive polarity or may be alternately positive and negative as desired. In some instances, when a source of positive trigger pulses is provided, the diode 52 will not be necessary. Output pulses may be taken from any convenient point in the circuit, such as, for example, a pair of output terminals 55, one of which is grounded and the other of which is connected with the collector 14 of the P–N–P transistor 8. Direct current clamping for stabilization purposes may be provided, if desired, by connecting the junction of the stabilizing resistor 32 and the emitter 22 through a diode 56 to a terminal 57, which may be connected to the negative terminal of a source of direct current potential.

In operation, consider that both transistors 8 and 18 are conducting. In this condition, negative base bias for the P–N–P transistor 8 is obtained from the terminal 42 so that a forward bias exists between the emitter 12 and the base 16. When a positive input or trigger pulse 53 is applied at the terminals 52 and to the base 16, the P–N–P transistor 8 is rendered non-conductive. When this happens, the voltage on the collector 14 becomes more negative, and since the collector 14 is connected directly with the base 26 the N–P–N transistor 18 will also be rendered non-conductive. The voltage on the collector 24 of the N–P–N transistor then becomes positive, which means that the point A, which is intermediate the storage capacitor 28 and the diode 30 becomes positive. Accordingly, the diode 30 is biased in the reverse direction and an open circuit exists between the terminal 42 and the base 16. Accordingly, the biasing voltage on the base 16 is obtained from the terminal 46 and the P–N–P transistor 8 remains biased off.

With both transistors in the non-conducting condition following the application of the positive trigger pulse, the storage capacitor 28 begins to charge through the resistor 40 at a rate which is determined by the time constant of the capacitor 28 and the resistors 40 and 36. Eventually, due to the charging of the capacitor 28, the point A becomes sufficiently negative to bias the diode 30 in the forward direction and the bias voltage between the emitter 12 and the base 16 of the P–N–P transistor 8 will be in the forward direction, since the base voltage for the P–N–P transistor is obtainable from the terminal 42. The P–N–P transistor 8 will then begin to conduct. The collector 14 of the transistor 8 then becomes less negative and the N–P–N transistor 18 will begin to conduct. The current flow in the collector 24 of the N–P–N transistor 18 thus discharges the capacitor 28 rapidly through the collector-to-emitter path of the transistor 18. The discharge time can thus be made as low as desired by drawing a large current through the transistor 18. This discharge is, moreover, with constant current because of the constant current collector characteristic of the junction transistor 18 and results in a linear discharge. In addition, the charge time of the capacitor is maintained substantially constant.

As described, therefore, it is seen that by providing a monostable multivibrator circuit in which opposite conductivity transistors are used, so that the timing capacitor may be discharged through one of the transistors, a relatively large ratio of charge to discharge time is readily obtainable. The circuit arrangement, moreover, is relatively simple and as will be seen hereinafter the circuit parameters are practical in value. The circuit operation is, in addition, reliable and efficient.

By adjusting the time constant that determines the charge time of the storage capacitor 28, a specific number of input trigger pulses can be applied to the terminals 51 without providing the circuit operation as described. Then, after the application of a predetermined number of pulses, the circuit operation will be as described above. Thus, a monostable multivibrator in accordance with the invention can be utilized as a frequency divider for counter applications. Other uses of such a circuit, such as a synchronizing generator in a television transmitter, will be obvious to those skilled in the art. As is well known, monostable multivibrator circuits have many applications and are used in a wide variety of electrical equipment.

While it will be understood that the circuit specifications may vary according to the design for any particular application, the following circuit specifications are included by way of example only. For these circuit specifications, the voltages which are applied to the terminals 34, 38, 42, 46, 50 and 57 are −18, +12, −30, +1, −7 and −4 volts respectively.

Resistors 36, 40, 44 and 48—1200; 47,000; 18,000; and 3900 ohms respectively
Capacitor 28—.01 microfarad A circuit of the type described is not restricted to junction transistors, although transistors of this type are generally to be preferred. Moreover, the specific conductivity types of the transistors used are not critical so long as they are of opposite conductivity types, as will be seen from a consideration of Figure 2.

Referring now to Figure 2, a monostable multivibrator circuit of the same general type as the circuit illustrated in Figure 1 includes a pair of transistors 58 and 68 which may be considered to be, by way of example, an N-P-N junction transistor and a P-N-P junction transistor respectively. Each of the transistors includes a semi-conductive body and three electrodes which are cooperatively associated with the body in a well known manner. Thus, the transistor 58 includes a semi-conductive body 60 and an emitter 62, a collector 64 and a base 66. In the same manner the transistor 68 includes a semi-conductive body 70 and an emitter 72, a collector 74 and a base 76. In the embodiment of the invention illustrated in Figure 2, the storage capacitor 28 is discharged through the P-N-P transistor 68 and the input trigger pulses 90 are of a negative polarity and are applied to the base 66 of the N-P-N transistor 58.

Another difference in the circuit illustrated in Figure 2 is that the diode has been eliminated in the connection between the collector of the discharge transistor and the base of the first transistor. Generally, the inclusion of the diode is to be preferred, since it insures that the first transistor remains non-conductive while the capacitor 28 charges. It should be understood, however, that the diode is not necessary for the proper operation of the circuit. If the diode were used in Figure 2, it would be reversed in polarity and a connection from the negative terminal of the battery 80 would be needed to the junction of the diode and the base 66 of the N-P-N transistor. Since the conductivity of the transistor has been reversed, the polarity of the various biasing potentials has also been reversed. To obtain the required biasing potentials, the circuit illustrated in Figure 2 shows one possible arrangement which uses a pair of batteries 78 and 80. The battery 78 has its negative terminal grounded and its positive terminal connected through the stabilizing resistor 32 to the emitter 72 of the P-N-P transistor 68. The positive terminal of the battery 78 is also connected through a resistor 40 to the point A and is thus effective to apply a positive voltage to the base 66 of the N-P-N transistor 58 when the transistors are conductive. The battery 78, in addition, supplies collector biasing voltage for the collector 64 of the N-P-N transistor 58. To this end, a voltage divider comprising the resistors 82 and 84 is provided between the positive terminal of battery 78 and ground. The junction of the resistors 82 and 84 is connected directly with the collector 64. The battery 80 has its positive terminal grounded and its negative terminal connected through the resistor 36 to the collector 74 of the P-N-P transistor 68.

Another difference in the circuit illustrated in Figure 2 is that the diodes 52 and 56 which are used for pulse steering and clamping, respectively, have been eliminated. In operation, the circuit illustrated in Figure 2 will be substantially identical to the one illustrated in Figure 1 except, of course, that the polarity of the various circuit potentials will be reversed. Since, however, the diode 30 has been eliminated, the transistor 58 remains nonconductive prior to the charging of the capacitor 28 due to the negative voltage at point A following the application of a trigger pulse to the circuit.

As described herein, the utilization of opposite conductivity transistors in a monostable multivibrator circuit is seen to provide several advantages. Stable and efficient circuit operation is easily obtainable. In addition, the ratio of charge to discharge time of the timing capacitor can be made as large as needed since its discharge is through one of the transistors. Thus, by provision of the invention, a multivibrator is provided which may find wide use wherever reliable yet efficient circuit operation is desired or required.

What is claimed is:

1. A monostable multivibrator circuit comprising, a first transistor of one conductivity type having a first base, a first emitter and a first collector electrode, a second transistor of an opposite conductivity type having a second base, a second emitter and a second collector electrode, means providing direct current biasing potentials for the emitter and collector electrodes of said devices, conductive circuit means directly connecting said first collector with said second base, means including a serially connected unilateral conducting element and a storage element connecting said first base with said second collector, means providing a conductive charge path for said storage element and forward biasing potentials for said unilateral conducting element connected with a point intermediate said storage element and said unilateral conducting element, means connected with said first base for applying trigger pulses thereto to render said transistors non-conductive whereby said storage element is charged, the collector-to-emitter path of said second transistor providing a conductive discharge path for said storage element, and output circuit means connected with said first collector electrode for deriving an output voltage wave therefrom.

2. A monostable multivibrator circuit comprising, a first and a second semi-conductor device of opposite conductivity types each including a base, an emitter and a collector electrode, means providing a direct current conductive connection between the collector of said first semi-conductor device and the base of said second semi-conductor device, means including a serially connected diode and a storage capacitor connecting the base of said first semi-conductor device with the collector of said second semi-conductor device, means providing a first source of potential connected with the base electrode of said first device for applying a biasing voltage in the reverse direction between the emitter and base electrodes of said first device when it is non-conductive, means including a second source of potential connected with the junction of said diode and said capacitor for charging said capacitor when said devices are non-conductive and for applying a biasing voltage in the forward direction between the emitter and base electrodes of said first device when said capacitor is charged to render said first and second devices conductive, and means for applying trigger pulses to the base of said first semi-conductor device for rendering said semi-conductor devices nonconductive whereby said storage capacitor is charged, said second semi-conductor device providing a conductive discharge path for said storage capacitor when said second semi-conductor device is conductive.

3. A monostable multivibrator circuit comprising, a first transistor of one conductivity type including a first base, a first emitter, and a first collector electrode, a second transistor of an opposite conductivity type including a second base, a second emitter and a second collector electrode, means providing a direct current conductive connection between said first collector and said second base, means including a diode and a storage capacitor serially connected in that order between said first base and said second collector, means providing a first and a second source of operating voltage of opposite polarities, means connecting said first source with said second collector and with said first base, means connecting said second source with said first collector, with said second emitter and to the junction of said diode and said storage capacitor, and an input circuit for applying trigger pulses of a predetermined polarity to said first base to render said first and second transistors nonconductive thereby to charge said storage capacitor, said first and second transistors being rendered conductive when said storage capacitor is charged whereby said second transistor provides a conductive discharge path for said storage capacitor.

References Cited in the file of this patent

UNITED STATES PATENTS

| | | |
|---|---|---|
| 2,655,609 | Shockley | Oct. 13, 1953 |
| 2,663,800 | Herzog | Dec. 22, 1953 |
| 2,698,416 | Sherr | Dec. 28, 1954 |
| 2,769,907 | Lohman | Nov. 6, 1956 |
| 2,770,732 | Chong | Nov. 13, 1956 |
| 2,788,449 | Bright | Apr. 9, 1957 |